(12) United States Patent
Matsushita et al.

(10) Patent No.: US 11,798,997 B2
(45) Date of Patent: Oct. 24, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kenichi Matsushita, Nonoichi Ishikawa (JP); Norio Yasuhara, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 127 days.

(21) Appl. No.: 17/471,628

(22) Filed: Sep. 10, 2021

(65) Prior Publication Data
US 2022/0302265 A1    Sep. 22, 2022

(30) Foreign Application Priority Data
Mar. 19, 2021    (JP) .................................. 2021-045947

(51) Int. Cl.
    *H01L 29/40*    (2006.01)
(52) U.S. Cl.
    CPC .................................. *H01L 29/404* (2013.01)
(58) Field of Classification Search
    CPC ............... H01L 29/404; H01L 29/0615; H01L 29/0638; H01L 29/0692; H01L 29/7823; H01L 29/7811; H01L 29/7802; H01L 29/7395
    USPC ....................................................... 257/356
    See application file for complete search history.

(56) References Cited

U.S. PATENT DOCUMENTS

| | | | |
|---|---|---|---|
| 7,719,076 B2 * | 5/2010 | Shu | H01L 29/404 257/E29.325 |
| 9,412,809 B2 | 8/2016 | Senoo | |
| 9,653,557 B2 | 5/2017 | Matsudai et al. | |
| 10,355,084 B1 | 7/2019 | Nishi et al. | |
| 10,461,161 B1 * | 10/2019 | Kinzer | H01L 29/7786 |

(Continued)

FOREIGN PATENT DOCUMENTS

| | | |
|---|---|---|
| JP | 2007-123570 A | 5/2007 |
| JP | 2014-038937 A | 2/2014 |
| JP | 5888465 B2 | 3/2016 |

(Continued)

*Primary Examiner* — Mohammad M Hoque
(74) *Attorney, Agent, or Firm* — Kim & Stewart LLP

(57) ABSTRACT

A semiconductor device includes: cell and termination regions; a first electrode; a semiconductor part on the first electrode; an insulating film on the semiconductor part in the termination region; mutually-separated second electrodes on the insulating film arranged in a direction from a center toward an outer perimeter of the semiconductor part when viewed from above; a first floating electrode in the insulating film overlapping a gap between an adjacent pair of the second electrodes when viewed from above, and facing one of the pair via the insulating film; and a second floating electrode in the insulating film and separated from and overlapping the first floating electrode in the gap when viewed from above, and facing the other of the pair of second electrodes via the insulating film, wherein the overlapping portion of the second floating electrode is positioned below a portion of the first floating electrode overlapping the gap.

6 Claims, 12 Drawing Sheets

(56) References Cited

U.S. PATENT DOCUMENTS

| | | | | |
|---|---|---|---|---|
| 2005/0161761 A1* | 7/2005 | Hatade | ............... | H01L 29/7816 |
| | | | | 257/490 |
| 2005/0194656 A1* | 9/2005 | Shimizu | ............. | H01L 29/0878 |
| | | | | 257/493 |

FOREIGN PATENT DOCUMENTS

| JP | 2016086002 A | * | 5/2016 |
|---|---|---|---|
| JP | 6101183 B2 | | 3/2017 |
| JP | 2019-149477 A | | 9/2019 |

* cited by examiner

SEMICONDUCTOR DEVICE

CROSS-REFERENCE TO RELATED APPLICATIONS

This application is based upon and claims the benefit of priority from the prior Japanese Patent Application No. 2021-045947, filed on Mar. 19, 2021; the entire contents of which are incorporated herein by reference.

FIELD

Embodiments described herein relate generally to a semiconductor device.

BACKGROUND

A known semiconductor device includes a cell region in which an element such as a diode, a transistor, or the like is located, and a termination region that surrounds the cell region. In an attempt to increase the breakdown voltage of such a semiconductor device, a structure is provided to suppress the spreading of a depletion layer into the termination region.

DETAILED DESCRIPTION

Figure 1:
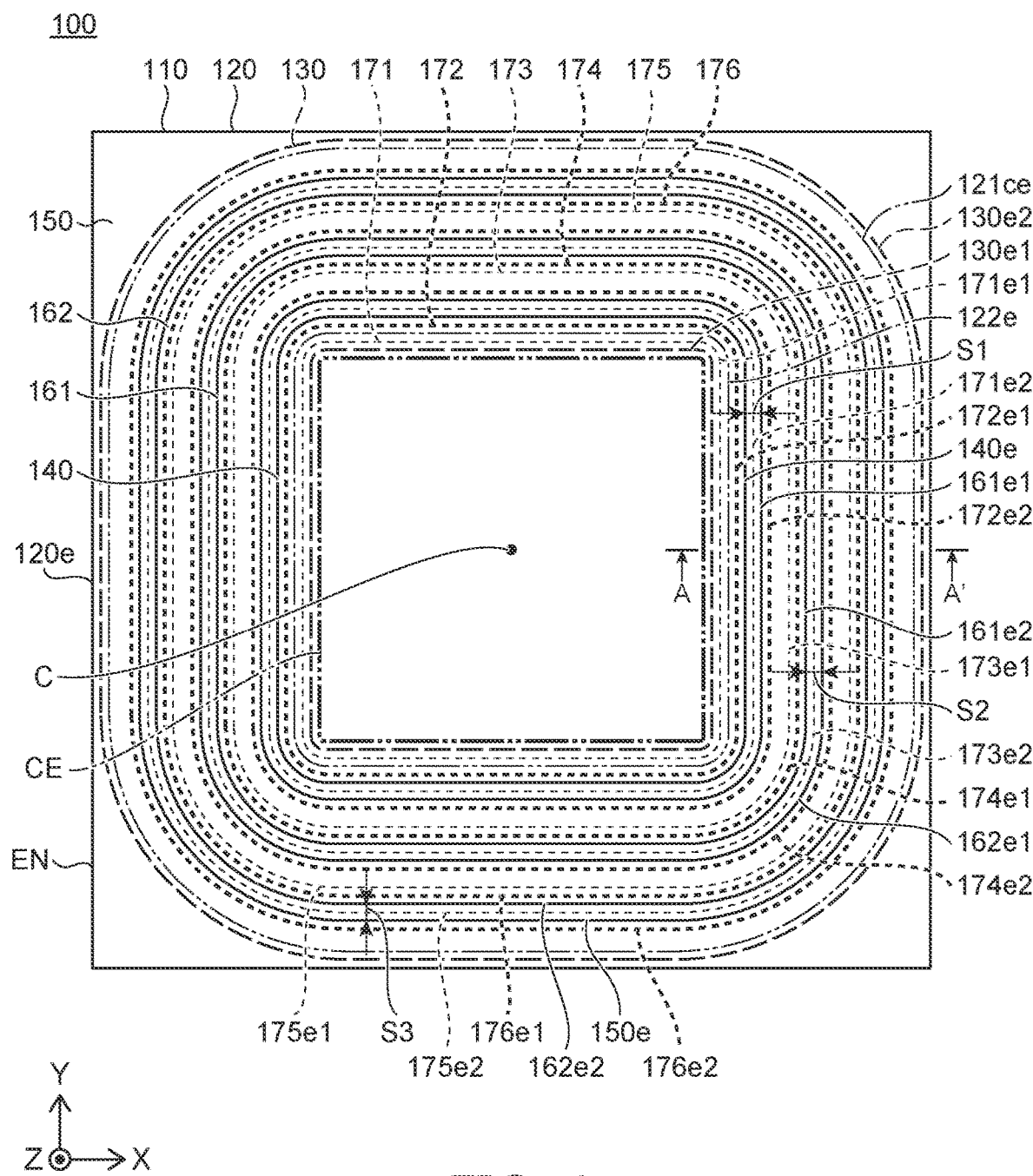
FIG. 1 is a top view showing a semiconductor device according to a first embodiment.

A semiconductor device according to an embodiment includes a cell region and a termination region set in the semiconductor device, in which the termination region surrounds the cell region, and the semiconductor device includes: a semiconductor part located on the first electrode; an insulating film located on the semiconductor part in the termination region; multiple second electrodes located on the insulating film, arranged in a direction from a center of the semiconductor part toward an outer perimeter of the semiconductor part when viewed from above, and separated from each other; a first floating electrode that is located in the insulating film, overlaps a gap between a pair of adjacent second electrodes among the multiple second electrodes when viewed from above, and faces one of the pair of second electrodes via the insulating film; and a second floating electrode that is separated from the first floating electrode, is located in the insulating film, overlaps the first floating electrode in the gap when viewed from above, faces the other of the pair of second electrodes via the insulating film, and includes a portion that overlaps the first floating electrode and is positioned below a portion of the first floating electrode overlapping the gap.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions. In the specification of the application and the drawings, components similar to those described in regard to a drawing thereinabove are marked with like reference numerals, and a detailed description is omitted as appropriate.

For easier understanding of the following description, the arrangements and configurations of the portions are described using an XYZ orthogonal coordinate system. The X-axis, the Y-axis, and the Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". Although the direction of the arrow in the Z-direction is taken as up and the opposite direction is taken as down for easier understanding of the description, these directions are independent of the direction of gravity.

Hereinbelow, the notations of $n^+$ and $n^-$ indicate relative levels of the impurity concentrations of an n-type semiconductor. Specifically, a notation marked with "+" indicates that the impurity concentration is relatively greater than that of a notation marked with "−". Here, when both an impurity that forms donors and an impurity that forms acceptors are included in each region, the "impurity concentration" means the net impurity concentration after the impurities cancel.

First Embodiment

First, a first embodiment will be described.

FIG. 1 is a top view showing a semiconductor device according to the embodiment.

Figure 2:
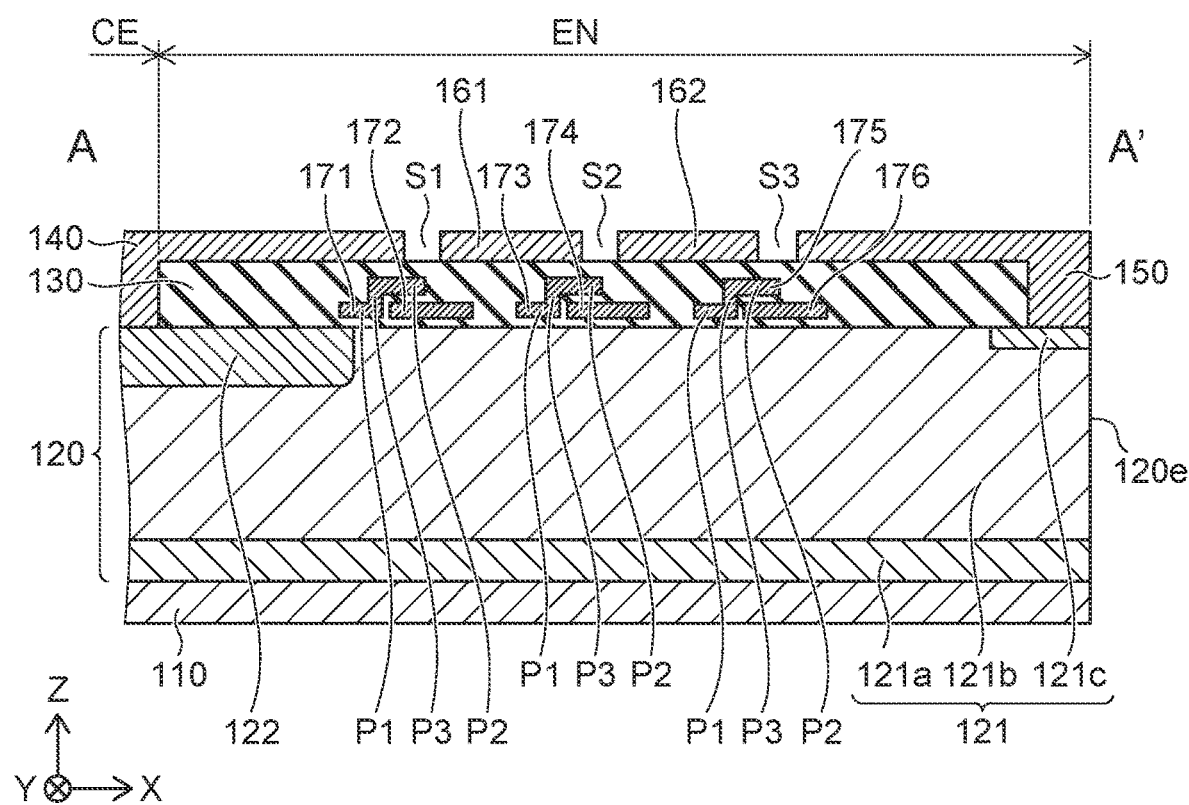
FIG. 2 is a cross-sectional view along line A-A' of FIG. 1.

FIG. 2 is a cross-sectional view along line A-A' of FIG. 1.

According to the embodiment, the semiconductor device 100 has a substantially rectangular parallelepiped shape. However, the shape of the semiconductor device is not particularly limited to the shape described above.

As shown in FIG. 1, a cell region CE and a termination region EN that surrounds the periphery of the cell region CE are set in the semiconductor device 100. In FIG. 1, the region that is surrounded with the innermost thick double dot-dash line is the cell region CE; and the entire region of the semiconductor device 100 further outward than the cell region CE is the termination region EN.

Not less than one type of element such as a diode, a transistor, or the like is located in the cell region CE. For example, a MOSFET (metal-oxide-semiconductor field-effect transistor), an IGBT (Insulated Gate Bipolar Transistor), etc., are examples of the transistor located in the cell region CE. The structure of the termination region EN is described below.

As shown in FIG. 2, the semiconductor device 100 includes a lower electrode 110, a semiconductor part 120, an insulating film 130, an upper electrode 140, an EQPR (EQuivalent-Potential Ring) electrode 150, intermediate electrodes 161 and 162, multiple first floating electrodes 171, 173, and 175, and multiple second floating electrodes 172, 174, and 176. According to the embodiment, the lower electrode 110 corresponds to a first electrode; and the upper electrode 140, the EQPR electrode 150, and the intermediate electrodes 161 and 162 correspond to a second electrode. Components of the semiconductor device 100 will now be elaborated.

The lower electrode 110 is located in substantially the entire region of the lower surface of the semiconductor device 100. In other words, the lower electrode 110 is located in substantially the entire region of the cell region CE and substantially the entire region of the termination region EN. The lower electrode 110 is flat-plate shaped. According to the embodiment as shown in FIG. 1, the shape of the lower electrode 110 when viewed from above is substantially rectangular. However, the shape of the lower electrode is not limited to the shape described above.

When a diode is located in the cell region CE, the lower electrode 110 functions as, for example, the cathode electrode of the diode. When a MOSFET is located in the cell region CE, the lower electrode 110 functions as, for example, the drain electrode of the MOSFET. When an IGBT is located in the cell region CE, the lower electrode 110 functions as, for example, the collector electrode of the IGBT.

As shown in FIG. 2, the semiconductor part 120 is located on the lower electrode 110 from the cell region CE to the termination region EN.

Figure 3:
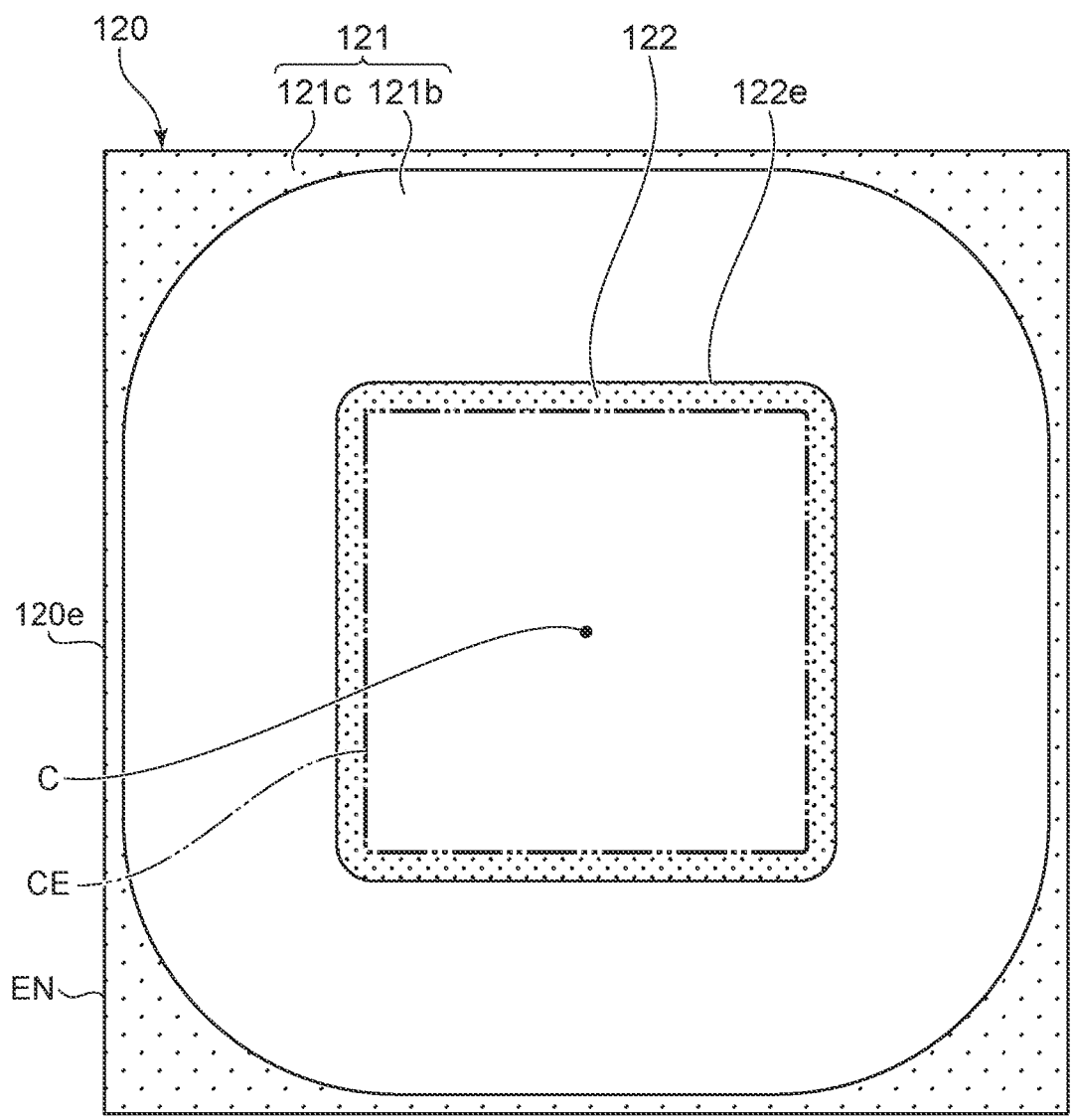
FIG. 3 is a top view showing a semiconductor part of a semiconductor device according to a first embodiment.

FIG. 3 is a top view showing the semiconductor part of the semiconductor device according to the embodiment.

In the termination region EN of FIG. 3, the region of the upper surface of the semiconductor part 120 in which an $n^+$-type stopper region 121c described below is located and the region of the upper surface of the semiconductor part 120 in which a p-type semiconductor layer 122 is located are shown by mutually-different dot patterns for easier understanding of the description.

The semiconductor part 120 includes, for example, silicon (Si). According to the embodiment, the semiconductor part 120 has a substantially rectangular parallelepiped shape. In the specification, component A being positioned between component B and a center C of the semiconductor part when viewed from above is called "component A positioned further inward than component B". Similarly, component A being positioned between component B and an outer perimeter 120e of the semiconductor part when viewed from above is called "component A positioned further outward than component B". According to the embodiment, the center C is positioned on an intersection of diagonal lines of the outer perimeter 120e. However, the shape of the semiconductor part is not limited to the shapes described above.

As shown in FIG. 2, the semiconductor part 120 includes an n-type semiconductor layer 121 and the p-type semiconductor layer 122. According to the embodiment, the n-type semiconductor layer 121 corresponds to a first semiconductor layer; and the p-type semiconductor layer 122 corresponds to a second semiconductor layer.

The n-type semiconductor layer 121 includes an $n^+$-type region 121a, an $n^-$-type region 121b, and the $n^+$-type stopper region 121c. According to the embodiment, the $n^+$-type region 121a corresponds to a first semiconductor region; the $n^-$-type region 121b corresponds to a second semiconductor region; and the $n^+$-type stopper region 121c corresponds to a third semiconductor region.

The $n^+$-type region 121a is located from the cell region CE to the termination region EN. The $n^+$-type region 121a is located on the lower electrode 110 in the termination region EN and contacts the lower electrode 110. Thereby, the $n^+$-type region 121a is electrically connected to the lower electrode 110.

When a diode is located in the cell region CE, the $n^+$-type region 121a is located on the lower electrode 110 and contacts the lower electrode 110 in the portion of the cell region CE in which the diode is located. When a MOSFET is located in the cell region CE, the $n^+$-type region 121a is located on the lower electrode 110 and contacts the lower electrode 110 in the portion of the cell region CE in which the MOSFET is located. When an IGBT is located in the cell region CE, in the portion of the cell region CE in which the IGBT is located, the p-type semiconductor layer is located on the lower electrode 110; and at least a portion of the $n^+$-type region 121a is located on the p-type semiconductor layer.

The $n^-$-type region 121b is located on the $n^+$-type region 121a from the cell region CE to the termination region EN. The impurity concentration of the $n^-$-type region 121b is less than the impurity concentration of the $n^+$-type region 121a.

The $n^+$-type stopper region 121c is located in the outer perimeter portion of the upper layer portion of the $n^-$-type region 121b in the termination region EN. The impurity concentration of the $n^+$-type stopper region 121c is greater than the impurity concentration of the $n^-$-type region 121b. As shown in FIG. 3, the $n^+$-type stopper region 121c has a substantially rectangular ring shape when viewed from above.

As shown in FIG. 2, the p-type semiconductor layer 122 is located in the upper layer portion of the n-type semiconductor layer 121, and more specifically, in the upper layer portion of the $n^-$-type region 121b. The p-type semiconductor layer 122 is located from the termination region EN to the cell region CE. The p-type semiconductor layer 122 is positioned further inward than the $n^+$-type stopper region 121c and is separated from the $n^+$-type stopper region 121c. As shown in FIG. 3, an outer perimeter 122e of the p-type semiconductor layer 122 is substantially rectangular with rounded corners when viewed from above.

When a diode is located in the cell region CE, the p-type semiconductor layer 122 may function as a p-type semiconductor layer that is connected to the anode electrode of the diode in the cell region CE. When a MOSFET or an IGBT is located in the cell region CE, the p-type semiconductor layer 122 may function as a p-type semiconductor layer that is adjacent to the gate electrode of the MOSFET or IGBT with an insulating film interposed in the cell region CE.

As shown in FIG. 2, the insulating film 130 is located on the semiconductor part 120 in the termination region EN.

Figure 4:
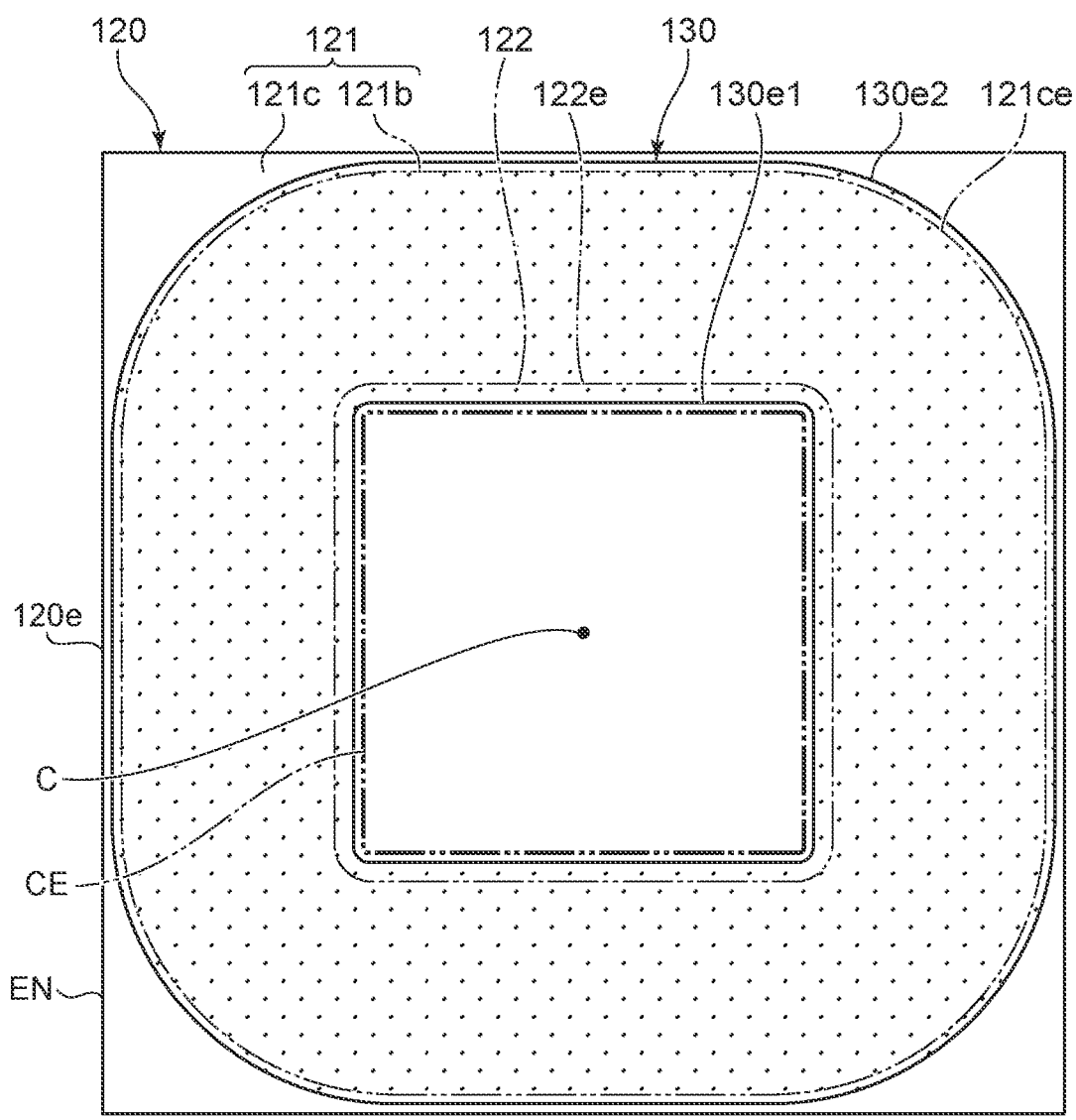
FIG. 4 is a top view showing the semiconductor part and an insulating film of the semiconductor device according to the first embodiment.

FIG. 4 is a top view showing the semiconductor part and the insulating film of the semiconductor device according to the embodiment.

In FIG. 4, the region in which the insulating film 130 is located in the termination region EN is shown by a dot pattern for easier understanding of the description.

Although not particularly limited, the insulating film 130 is made of, for example, an insulating material such as an oxide such as a silicon oxide film or the like, a nitride such as silicon nitride, etc. According to the embodiment, the insulating film 130 has a substantially rectangular ring shape with rounded corners when viewed from above. However, the shape of the insulating film is not limited to the shape described above.

According to the embodiment, an inner perimeter 130e1 of the insulating film 130 is positioned further inward than the outer perimeter 122e of the p-type semiconductor layer 122 when viewed from above. According to the embodiment, an outer perimeter 130e2 of the insulating film 130 is positioned further outward than an inner perimeter 121ce of the n$^+$-type stopper region 121c when viewed from above. Accordingly, according to the embodiment when viewed from above, the insulating film 130 overlaps the outer perimeter portion of the p-type semiconductor layer 122 and partially overlaps the portion of the n-type semiconductor layer 121 positioned further outward than the p-type semiconductor layer 122.

As shown in FIG. 2, the upper electrode 140, the EQPR electrode 150, and the multiple intermediate electrodes 161 and 162 are located on the insulating film 130.

Figure 5:
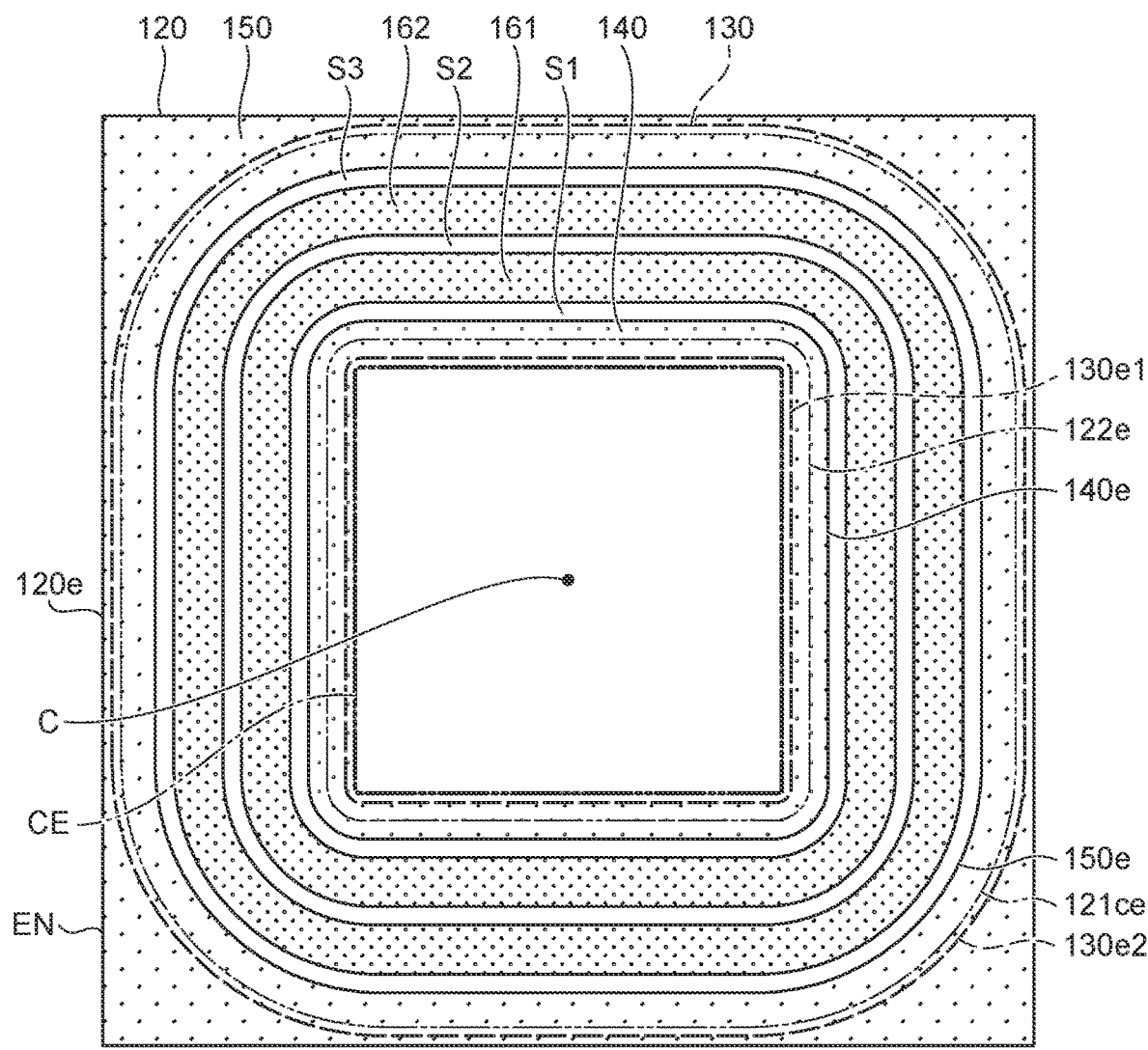
FIG. 5 is a top view showing the semiconductor part, the insulating film, an upper electrode, an EQPR electrode, and multiple intermediate electrodes of the semiconductor device according to the first embodiment.

FIG. 5 is a top view showing the semiconductor part, the insulating film, the upper electrode, the EQPR electrode, and the multiple intermediate electrodes of the semiconductor device according to the embodiment.

In the termination region EN of FIG. 5, the regions in which the upper electrode 140, the EQPR electrode 150, and the multiple intermediate electrodes 161 and 162 are located are shown by mutually-different dot patterns. The upper electrode 140, the EQPR electrode 150, and the multiple intermediate electrodes 161 and 162 will now be described.

First, the upper electrode 140 will be described.

Although not particularly limited, the upper electrode 140 is made of, for example, a metal material such as aluminum (Al), etc. As shown in FIG. 2, the upper electrode 140 is located from the cell region CE to the termination region EN. Specifically, the upper electrode 140 covers a portion of the upper surface of the p-type semiconductor layer 122, the inner perimeter surface of the insulating film 130, and an inner region of the upper surface of the insulating film 130. The upper electrode 140 contacts the p-type semiconductor layer 122 and is thereby electrically connected to the p-type semiconductor layer 122.

When a diode is located in the cell region CE, the upper electrode 140 may function as the anode electrode of the diode in the cell region CE. When a MOSFET is located in the cell region CE, the upper electrode 140 may function as the source electrode of the MOSFET in the cell region CE. When an IGBT is located in the cell region CE, the upper electrode 140 may function as the emitter electrode of the IGBT in the cell region CE.

According to the embodiment as shown in FIG. 5, an outer perimeter 140e of the upper electrode 140 is substantially rectangular with rounded corners when viewed from above. The outer perimeter 140e of the upper electrode 140 is positioned further outward than the inner perimeter 130e1 of the insulating film 130 and the outer perimeter 122e of the p-type semiconductor layer 122 when viewed from above.

The EQPR electrode 150 will now be described.

Although not particularly limited, the EQPR electrode 150 is made of, for example, a metal material such as aluminum (Al), etc. When viewed from above, the EQPR electrode 150 is located further outward than the upper electrode 140 and is separated from the upper electrode 140. As shown in FIG. 2, the EQPR electrode 150 covers an outer region of the upper surface of the insulating film 130, the outer perimeter surface of the insulating film 130, and a region of the upper surface of the n$^+$-type stopper region 121c that is exposed from under the insulating film 130. The EQPR electrode 150 contacts the n$^+$-type stopper region 121c and is thereby electrically connected to the n$^+$-type stopper region 121c.

According to the embodiment as shown in FIG. 5, the EQPR electrode 150 has a substantially rectangular ring shape when viewed from above. The outer perimeter of the EQPR electrode 150 substantially matches the outer perimeter 120e of the semiconductor part 120 when viewed from above. An inner perimeter 150e of the EQPR electrode 150 is positioned further inward than the outer perimeter 130e2 of the insulating film 130 and the inner perimeter 121ce of the n$^+$-type stopper region 121c when viewed from above.

Although not particularly limited, the intermediate electrodes 161 and 162 each are made of, for example, a metal material such as aluminum (Al), etc. The multiple intermediate electrodes 161 and 162 are located on the insulating film 130. The multiple intermediate electrodes 161 and 162 are positioned between the upper electrode 140 and the EQPR electrode 150. Specifically, when viewed from above, the intermediate electrode 161 is located further outward than the upper electrode 140 and is separated from the upper electrode 140. When viewed from above, the intermediate electrode 162 is located further outward than the intermediate electrode 161 and further inward than the EQPR electrode 150, and is separated from the intermediate electrode 161 and the EQPR electrode 150.

Thus, the upper electrode 140, the multiple intermediate electrodes 161 and 162, and the EQPR electrode 150 are arranged in a direction from the center C of the semiconductor part 120 toward the outer perimeter 120e when viewed from above and are separated from each other. According to the embodiment, the upper electrode 140 and the intermediate electrode 161 correspond to a pair of adjacent second electrodes. Similarly, according to the embodiment, the intermediate electrode 161 and the intermediate electrode 162 also correspond to a pair of adjacent second electrodes. Similarly, according to the embodiment, the intermediate electrode 162 and the EQPR electrode 150 also correspond to a pair of adjacent second electrodes.

According to the embodiment, the intermediate electrodes 161 and 162 each have a substantially rectangular ring shape with rounded corners when viewed from above. Although two of the intermediate electrodes 161 and 162 are located in the semiconductor device 100 according to the embodiment, the number of intermediate electrodes located in the semiconductor device may be one, three, or more. An intermediate electrode may not be included in the semiconductor device. In such a case, the upper electrode and the EQPR electrode correspond to a pair of adjacent second electrodes.

Accordingly, according to the embodiment as shown in FIGS. 2 and 5, a ring-shaped gap S1 is provided between the upper electrode 140 and the intermediate electrode 161. Also, a ring-shaped gap S2 is provided between the two intermediate electrodes 161 and 162. Also, a ring-shaped gap S3 is provided between the intermediate electrode 162 and the EQPR electrode 150.

As shown in FIG. 2, the multiple first floating electrodes 171, 173, and 175 and the multiple second floating electrodes 172, 174, and 176 are located in the insulating film 130.

Figure 6:
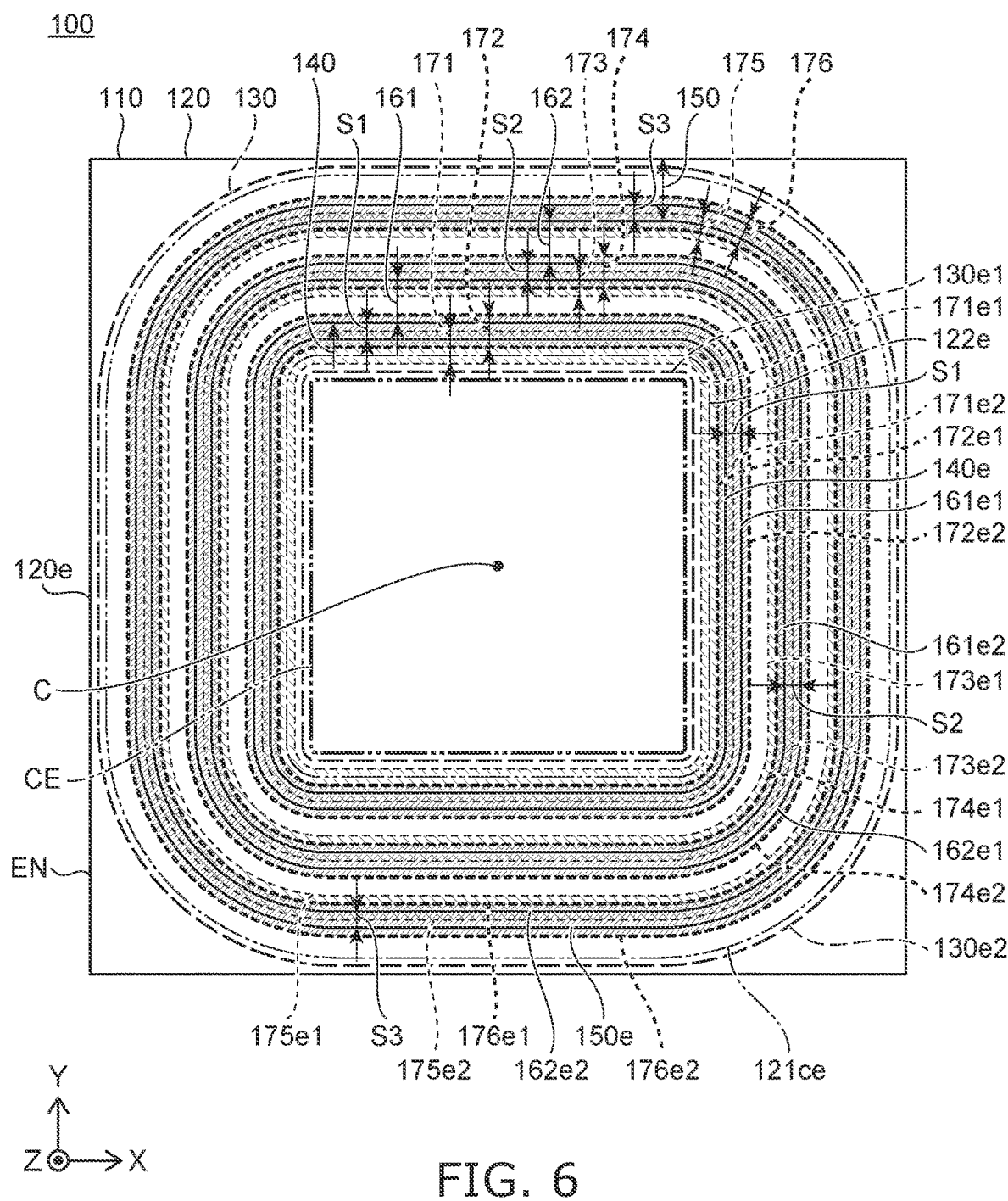
FIG. 6 is a top view showing regions in which floating electrodes are located in the semiconductor device according to the first embodiment.

FIG. 6 is a top view showing the region in which the floating electrodes are located in the semiconductor device according to the embodiment.

In the termination region EN of FIG. 6, the region in which the first floating electrodes 171, 173, and 175 are located and the region in which the second floating electrodes 172, 174, and 176 are located are shown by mutually-different diagonal-line patterns.

Although not particularly limited, the floating electrodes 171 to 176 are made of a conductive material such as a metal material, polysilicon that includes an impurity, etc. Each floating electrodes 171 to 176 has a substantially rectangular ring shape with rounded corners when viewed from above. As shown in FIG. 2, the multiple floating electrodes 171 to 176 are separated from each other. The entirety of the floating electrodes 171 to 176 is covered with the insulating film 130.

The positions of the floating electrodes 171 to 176 will now be elaborated.

First, the position of the first floating electrode 171 will be described.

As shown in FIGS. 2 and 6, the first floating electrode 171 overlaps the gap S1 and the upper electrode 140 when viewed from above. The first floating electrode 171 faces the upper electrode 140 via the insulating film 130. In the specification, "A overlaps B when viewed from above" means that at least a portion of A and at least a portion of B overlap when A and B are appropriately viewed as see-through from above.

As shown in FIG. 6, an inner perimeter 171e1 of the first floating electrode 171 is positioned further outward than the inner perimeter 130e1 of the insulating film 130 and further inward than the outer perimeter 122e of the p-type semiconductor layer 122 when viewed from above. According to the embodiment, an outer perimeter 171e2 of the first floating electrode 171 is positioned in the gap S1 when viewed from above.

The position of the second floating electrode 172 will now be described.

As shown in FIGS. 2 and 6, the second floating electrode 172 overlaps the first floating electrode 171 in the gap S1 when viewed from above. Also, the second floating electrode 172 overlaps the intermediate electrode 161 when viewed from above. The second floating electrode 172 faces the intermediate electrode 161 via the insulating film 130.

As shown in FIG. 6, an inner perimeter 172e1 of the second floating electrode 172 is positioned further inward than the outer perimeter 140e of the upper electrode 140 when viewed from above. An outer perimeter 172e2 of the second floating electrode 172 is positioned outward of an inner perimeter 161e1 of the intermediate electrode 161 when viewed from above.

The position of the first floating electrode 173 will now be described.

The first floating electrode 173 is positioned outward of the floating electrodes 171 and 172 when viewed from above. As shown in FIGS. 2 and 6, the first floating electrode 173 overlaps the gap S2 and the intermediate electrode 161 when viewed from above. The first floating electrode 173 faces the intermediate electrode 161 via the insulating film 130.

As shown in FIG. 6, an inner perimeter 173e1 of the first floating electrode 173 is positioned further outward than the outer perimeter 172e2 of the second floating electrode 172 and further inward than an outer perimeter 161e2 of the intermediate electrode 161 when viewed from above. According to the embodiment, an outer perimeter 173e2 of the first floating electrode 173 is positioned in the gap S2 when viewed from above.

The position of the second floating electrode 174 will now be described.

As shown in FIGS. 2 and 6, the second floating electrode 174 overlaps the first floating electrode 173 in the gap S2 when viewed from above. Also, the second floating electrode 174 overlaps the intermediate electrode 162 when viewed from above. The second floating electrode 174 faces the intermediate electrode 162 via the insulating film 130.

As shown in FIG. 6, an inner perimeter 174e1 of the second floating electrode 174 is positioned further inward than the outer perimeter 161e2 of the intermediate electrode 161 when viewed from above. An outer perimeter 174e2 of the second floating electrode 174 is positioned outward of an inner perimeter 162e1 of the intermediate electrode 162 when viewed from above.

The position of the first floating electrode 175 will now be described.

As shown in FIGS. 2 and 6, the first floating electrode 175 is positioned outward of the floating electrodes 173 and 174 when viewed from above. The first floating electrode 175 overlaps the gap S3 and the intermediate electrode 162 when viewed from above. The first floating electrode 175 faces the intermediate electrode 162 via the insulating film 130.

An inner perimeter 175e1 of the first floating electrode 175 is positioned further outward than the outer perimeter 174e2 of the second floating electrode 174 and further inward than an outer perimeter 162e2 of the intermediate electrode 162 when viewed from above. According to the embodiment, an outer perimeter 175e2 of the first floating electrode 175 is positioned in the gap S3 when viewed from above.

The position of the second floating electrode 176 will now be described.

As shown in FIGS. 2 and 6, the second floating electrode 176 overlaps the floating electrode 175 in the gap S3 when viewed from above. Also, the second floating electrode 176 overlaps the EQPR electrode 150 when viewed from above. The second floating electrode 176 faces the EQPR electrode 150 via the insulating film 130.

As shown in FIG. 6, an inner perimeter 176e1 of the second floating electrode 176 is positioned further inward than the outer perimeter 162e2 of the intermediate electrode 162 when viewed from above. An outer perimeter 176e2 of the second floating electrode 176 is positioned further outward than the inner perimeter 150e of the EQPR electrode 150 and further inward than the inner perimeter 121ce of the $n^+$-type stopper region 121c when viewed from above.

Although the positions of the outer perimeters and inner perimeters of the floating electrodes 171 to 176 are described above, the positions of the outer perimeters and inner perimeters of the floating electrodes 171 to 176 are not limited to the positions described above.

Specific shapes of the floating electrodes 171 to 176 will now be described.

According to the embodiment as shown in FIG. 2, the first floating electrode 171 includes a first portion P1 that is positioned further inward than the second floating electrode 172 and is adjacent to the second floating electrode 172 in the direction from the center C of the semiconductor part 120 toward the outer perimeter 120e, a second portion P2 that is positioned above the second floating electrode 172, and a third portion P3 that is positioned between the first portion P1 and the second portion P2 and is linked to the first and second portions P1 and P2.

According to the embodiment, the first portion P1 and the second portion P2 each extend in the direction from the center C of the semiconductor part 120 toward the outer perimeter 120e. According to the embodiment, the third portion P3 extends in the Z-direction from the outer end portion of the first portion P1 toward the inner end portion of the second portion P2. A portion of the second portion P2 overlaps the gap S1 when viewed from above. The first portion P1, another portion of the second portion P2, and the third portion P3 overlap the upper electrode 140 when viewed from above. The other first floating electrodes 173 and 175 also each include the first portion P1, the second portion P2, and the third portion P3 similarly to the first floating electrode 171.

According to the embodiment, the second floating electrodes 172, 174, and 176 each have flat plate shapes extending in the direction from the center C of the semiconductor part 120 toward the outer perimeter 120e.

However, the shapes of the floating electrodes 171, 172, 173, 174, 175, and 176 are not limited to the shapes described above.

An operation of the termination region EN of the semiconductor device 100 will now be described.

Figure 7:
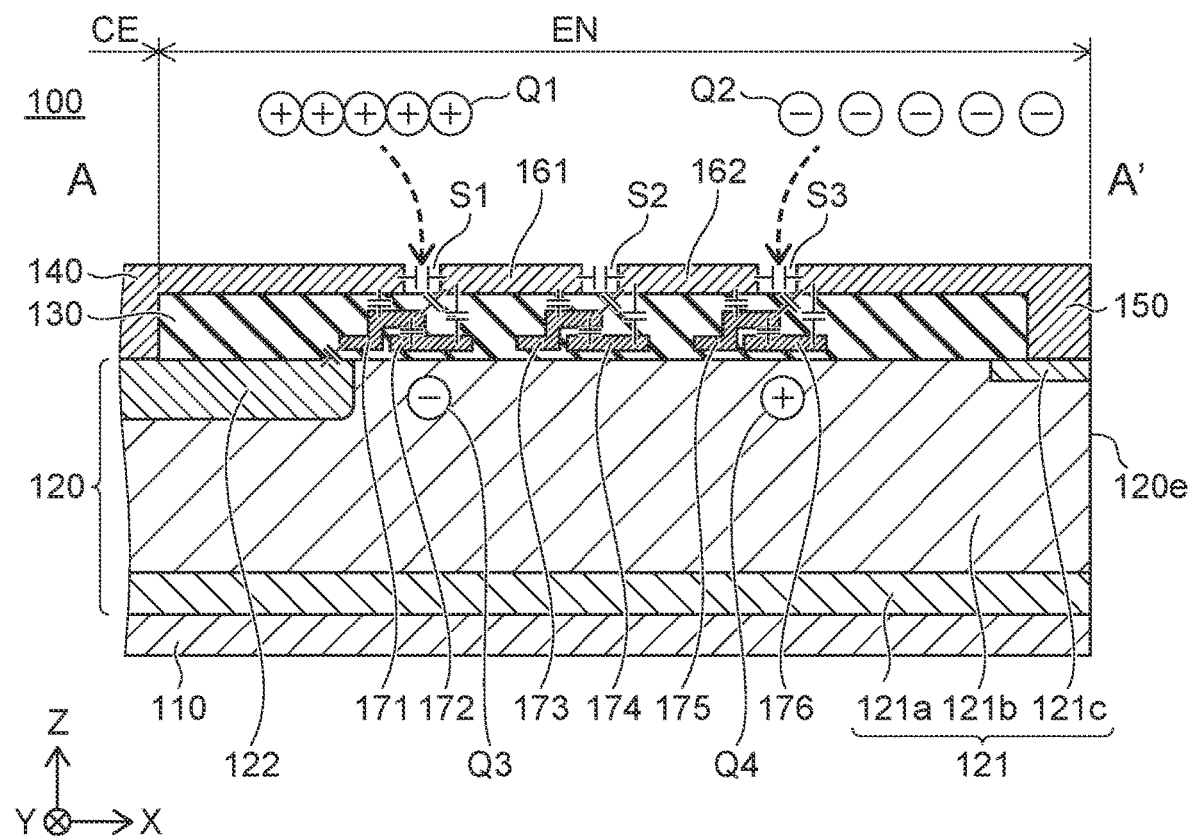
FIG. 7 is a schematic view showing an operation of a termination region of the semiconductor device according to the first embodiment.

FIG. 7 is a schematic view showing an operation of the termination region of the semiconductor device according to the embodiment.

In the termination region EN, when a voltage, i.e., a reverse-biased voltage, that causes the potential of the lower electrode 110 to be greater than the potential of the upper electrode 140 is applied between the lower electrode 110 and the upper electrode 140, a depletion layer spreads from the p-type semiconductor layer 122 toward the outer perimeter surface of the semiconductor part 120. Defects exist in the outer perimeter surface of the semiconductor part 120 when the outer perimeter surface is formed by cutting such as dicing, etc. Therefore, there is a possibility that the vicinity of the outer perimeter surface of the semiconductor part 120 cannot withstand a strong electrical field generated by the depletion layer. According to the embodiment, the n$^+$-type region 121a, the n$^-$-type region 121b, and the n$^+$-type stopper region 121c are electrically connected between the EQPR electrode 150 and the lower electrode 110. Therefore, the EQPR electrode 150 and the lower electrode 110 are substantially equipotential. Thereby, the depletion layer can be prevented from reaching the outer perimeter surface of the semiconductor part 120.

An electric field is generated between the p-type semiconductor layer 122 and the n$^+$-type stopper region 121c by the depletion layer that spreads from the p-type semiconductor layer 122 toward the outer perimeter surface of the semiconductor part 120. When the potential abruptly changes at a location between the p-type semiconductor layer 122 and the n$^+$-type stopper region 121c, that is, when a location at which equipotential lines are dense exists, avalanche breakdown may occur at that location.

Figure 8:
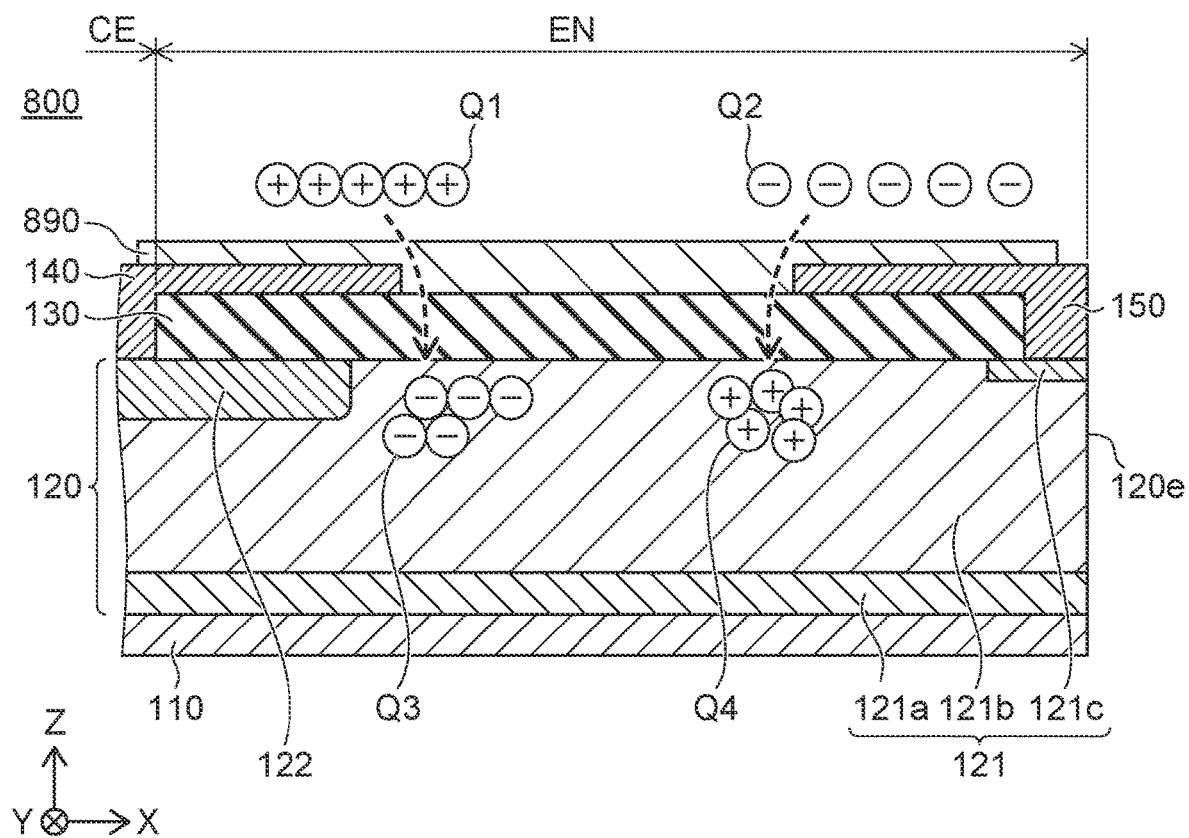
FIG. 8 is a cross-sectional view showing a termination region of a semiconductor device according to a reference example.

FIG. 8 is a cross-sectional view showing a termination region of a semiconductor device according to a reference example.

The semiconductor device 800 according to the reference example differs from the semiconductor device 100 according to the embodiment in that the floating electrodes 171 to 176 and the intermediate electrodes 161 and 162 are not included, and a semi-insulating film 890 is located in the gap between the upper electrode 140 and the EQPR electrode 150. The semi-insulating film 890 is, for example, a silicon nitride film to which hydrogen is added, etc.

It is expected that by providing the semi-insulating film 890 that has uniform characteristics such as the electrical resistance, etc., in the semiconductor device 800 according to the reference example, the potential can gradually change from the upper electrode 140 toward the EQPR electrode 150 due to the semi-insulating film 890. The occurrence of a location at which the potential abruptly changes in a portion of the semiconductor part 120 positioned between the upper electrode 140 and the EQPR electrode 150 can be suppressed thereby. However, actually, there are cases where the characteristics of the semi-insulating film 890 such as the electrical resistance, etc., are nonuniform, and effects such as those described above are insufficiently obtained. Also, when a semi-insulating film is not provided in the cell region CE, a new dedicated apparatus may be necessary to form the semi-insulating film 890 in the termination region EN.

Conversely, according to the embodiment as shown in FIG. 7, the upper electrode 140 and the first floating electrode 171 are capacitively coupled, the first floating electrode 171 and the second floating electrode 172 are capacitively coupled, and the second floating electrode 172 and the intermediate electrode 161 are capacitively coupled. The capacitive coupling of two electrodes is shown by connecting the two electrodes with the circuit symbol of a capacitor in FIG. 7 for easier understanding of the description. Here, "electrode A and electrode B are capacitively coupled" means that electrode A and electrode B face each other via an insulating body, and that electrode A, electrode B, and the insulating body between electrode A and electrode B function as a capacitor. Thus, multiple capacitors are interposed between the upper electrode 140 and the intermediate electrode 161. Therefore, the potential can be changed in stages from the upper electrode 140 to the intermediate electrode 161.

Similarly, according to the embodiment, the intermediate electrode 161 and the first floating electrode 173 are capacitively coupled, the first floating electrode 173 and the second floating electrode 174 are capacitively coupled, and the second floating electrode 174 and the intermediate electrode 162 are capacitively coupled. Therefore, the potential can be changed in stages from the intermediate electrode 161 to the intermediate electrode 162.

Similarly, according to the embodiment, the intermediate electrode 162 and the first floating electrode 175 are capacitively coupled, the first floating electrode 175 and the second floating electrode 176 are capacitively coupled, and the second floating electrode 176 and the EQPR electrode 150 are capacitively coupled. Therefore, the potential can be changed in stages from the intermediate electrode 162 to the EQPR electrode 150.

The multiple intermediate electrodes 161 and 162 are floating electrodes that can have any potential between the potential of the upper electrode 140 and the potential of the EQPR electrode 150. Therefore, the potential can be changed in stages from the upper electrode 140 to the EQPR electrode 150. As a result, the occurrence of a location at which the potential abruptly changes in a portion of the semiconductor part 120 positioned between the upper electrode 140 and the EQPR electrode 150 can be suppressed.

Also, because the intermediate electrodes 161 and 162 and the floating electrodes 171 to 176 are made of general materials used in the cell region CE, it is unnecessary to prepare a dedicated apparatus for forming these electrodes.

There also may be capacitive coupling between the upper electrode 140 and the intermediate electrode 161, between the intermediate electrode 161 and the intermediate electrode 162, and between the intermediate electrode 162 and the EQPR electrode 150. There also may be capacitive coupling between the first floating electrode 171 and the intermediate electrode 161, between the first floating electrode 173 and the intermediate electrode 162, and between the first floating electrode 175 and the EQPR electrode 150. There also may be capacitive coupling between the p-type semiconductor layer 122 and the first floating electrode 171.

As shown in FIG. 8, when the semiconductor device 800 according to the reference example is mounted on a leadframe, a substrate, etc., and sealed with a sealing member made of a resin material, etc., there are cases where positive ions that are included in the sealing member are attracted to the upper electrode 140; and a positive charge Q1 may occur at the vicinity of the surface of the semi-insulating film 890. Similarly, there are cases where negative ions that are included in the sealing member are attracted to the EQPR electrode 150; and a negative charge Q2 may occur at the vicinity of the surface of the semi-insulating film 890.

When the charges Q1 and Q2 thus occur at the vicinity of the surface of the semi-insulating film 890, it is expected that the semi-insulating film 890 can suppress the occurrence of a negative charge Q3 in the upper layer portion of the semiconductor part 120 due to the effects of the positive charge Q1 and suppress the occurrence of a positive charge Q4 in the upper layer portion of the semiconductor part 120 due to the effects of the negative charge Q2. However, actually, there are cases where the characteristics of the semi-insulating film 890 such as the electrical resistance, etc., are nonuniform, and effects such as those described above are insufficiently obtained.

Conversely, according to the embodiment as shown in FIG. 7, the multiple intermediate electrodes 161 and 162 are located between the upper electrode 140 and the EQPR electrode 150. Also, the two floating electrodes 171 and 172 overlap under the gap S1; the two floating electrodes 173 and 174 overlap under the gap S2; and the two floating electrodes 175 and 176 overlap under the gap S3. Therefore, the occurrence of the charges Q3 and Q4 in the upper layer portion of the semiconductor part 120 due to the effects of the charges Q1 and Q2 can be suppressed by the multiple intermediate electrodes 161 and 162 and the overlapping floating electrodes 171 to 176 functioning as a shield.

Effects of the embodiment will now be described.

In the semiconductor device 100 according to the embodiment, the insulating film 130 is located on the semiconductor part 120 in the termination region EN. The upper electrode 140, the multiple intermediate electrodes 161 and 162, and the EQPR electrode 150 are located on the insulating film 130. These electrodes 140, 161, 162, and 150 are arranged in the direction from the center C of the semiconductor part 120 toward the outer perimeter 120e when viewed from above and are separated from each other.

Also, the first floating electrode 171 and the second floating electrode 172 are located in the insulating film 130. Among these electrodes 140, 161, 162, and 150, the first floating electrode 171 overlaps the gap S1 of the adjacent pair of electrodes 140 and 161 when viewed from above, and faces the electrode 140, i.e., one of the adjacent pair of electrodes 140 and 161, via the insulating film 130. The second floating electrode 172 is separated from the first floating electrode 171, is located in the insulating film 130, and overlaps the first floating electrode 171 in the gap S1 when viewed from above. The second floating electrode 172 faces the electrode 161, i.e., the other of the adjacent pair of electrodes 140 and 161, via the insulating film 130. The portion of the second floating electrode 172 that overlaps the first floating electrode 171 is positioned below the portion of the first floating electrode 171 that overlaps the gap S1.

Therefore, the first floating electrode 171 and the electrode 140, i.e., the one of the adjacent pair of electrodes 140 and 161, are capacitively coupled, the first floating electrode 171 and the second floating electrode 172 are capacitively coupled, and the second floating electrode 172 and the electrode 161, i.e., the other of the adjacent pair of electrodes 140 and 161, are capacitively coupled. Thereby, in the termination region EN, the potential of the portion of the semiconductor part 120 positioned between the adjacent pair of electrodes 140 and 161 can be changed in stages. As a result, the occurrence of a location at which the potential abruptly changes in a portion of the semiconductor part 120 positioned between the adjacent pair of electrodes 140 and 161 can be suppressed. Avalanche breakdown can be suppressed thereby, and the breakdown voltage of the semiconductor device 100 can be increased. Similar effects also can be obtained by the other first floating electrodes 173 and 175 and the other second floating electrodes 174 and 176.

The occurrence of the charges Q3 and Q4 in the upper layer portion of the semiconductor part 120 can be suppressed by the first floating electrode 171 and the second floating electrode 172 that overlap below the gap S1 functioning as a shield for the charges Q1 and Q2 generated at the vicinity of the surface of the semiconductor device 100. Similar effects also can be obtained by the other first floating electrodes 173 and 175 and the other second floating electrodes 174 and 176.

Thus, a highly-reliable semiconductor device 100 can be realized.

According to the embodiment, the first floating electrode 171 overlaps the electrode 140 that is positioned inward among the adjacent pair of electrodes 140 and 161 when viewed from above. The second floating electrode 172 overlaps the electrode 161 that is positioned outward among the adjacent pair of electrodes 140 and 161 when viewed from above. Therefore, the equipotential lines of the semiconductor part 120 in the termination region EN are easily dispersed. The other first floating electrodes 173 and 175 and the other second floating electrodes 174 and 176 also have similar configurations and can obtain similar effects.

According to the embodiment, the first floating electrode 171 includes the first portion P1 that is positioned further inward than the second floating electrode 172 and is adjacent to the second floating electrode 172 in the direction from the center C of the semiconductor part 120 toward the outer perimeter 120e, the second portion P2 that is positioned above the second floating electrode 172, and the third portion P3 that is positioned between the first portion P1 and the second portion P2 and is linked to the first and second portions P1 and P2. Therefore, the equipotential lines of the semiconductor part 120 in the termination region EN are easily dispersed. The other first floating electrodes 173 and 175 and the other second floating electrodes 174 and 176 also have similar configurations and can obtain similar effects.

According to the embodiment, the semiconductor part 120 includes the n-type semiconductor layer 121 that is located on the lower electrode 110, and the p-type semiconductor layer 122 that is located in the upper layer portion of the n-type semiconductor layer 121 and is positioned further inward than the outer perimeter of the n-type semiconductor layer 121. When viewed from above, the insulating film 130 overlaps the outer perimeter portion of the p-type semiconductor layer 122 and overlaps the portion of the n-type semiconductor layer 121 positioned further outward than the p-type semiconductor layer 122. The electrode 140 that is positioned innermost among the multiple electrodes 140, 161, 162, and 150 is connected to the portion of the p-type semiconductor layer 122 that is positioned further inward than the insulating film 130. The electrode 150 that is positioned outermost among the multiple electrodes 140, 161, 162, and 150 is connected to the portion of the n-type semiconductor layer 121 that is positioned further outward than the insulating film 130. Therefore, the EQPR electrode 150, the outer perimeter portion of the n-type semiconductor layer 121, and the lower electrode 110 can be substantially equipotential, and the depletion layer can be provided from reaching the outer perimeter surface of the semiconductor part 120. As a result, the breakdown voltage of the semiconductor device 100 can be increased.

According to the embodiment, the n-type semiconductor layer 121 includes the $n^+$-type region 121a that is located on the lower electrode 110, the $n^-$-type region 121b that is located on the $n^+$-type region 121a and has an impurity concentration that is less than the impurity concentration of the $n^+$-type region 121a, and the $n^+$-type stopper region 121c that is located in the outer perimeter portion of the upper layer portion of the $n^-$-type region 121b and has an impurity concentration that is greater than the impurity concentration of the $n^-$-type region 121b. The electrode 150 that is positioned outermost is connected to the $n^+$-type stopper region 121c. Therefore, the EQPR electrode 150, the outer perimeter portion of the n-type semiconductor layer 121, and the lower electrode 110 can be substantially equipotential, and the depletion layer can be provided from reaching the outer perimeter surface of the semiconductor part 120.

Second Embodiment

A second embodiment will now be described.

Figure 9:
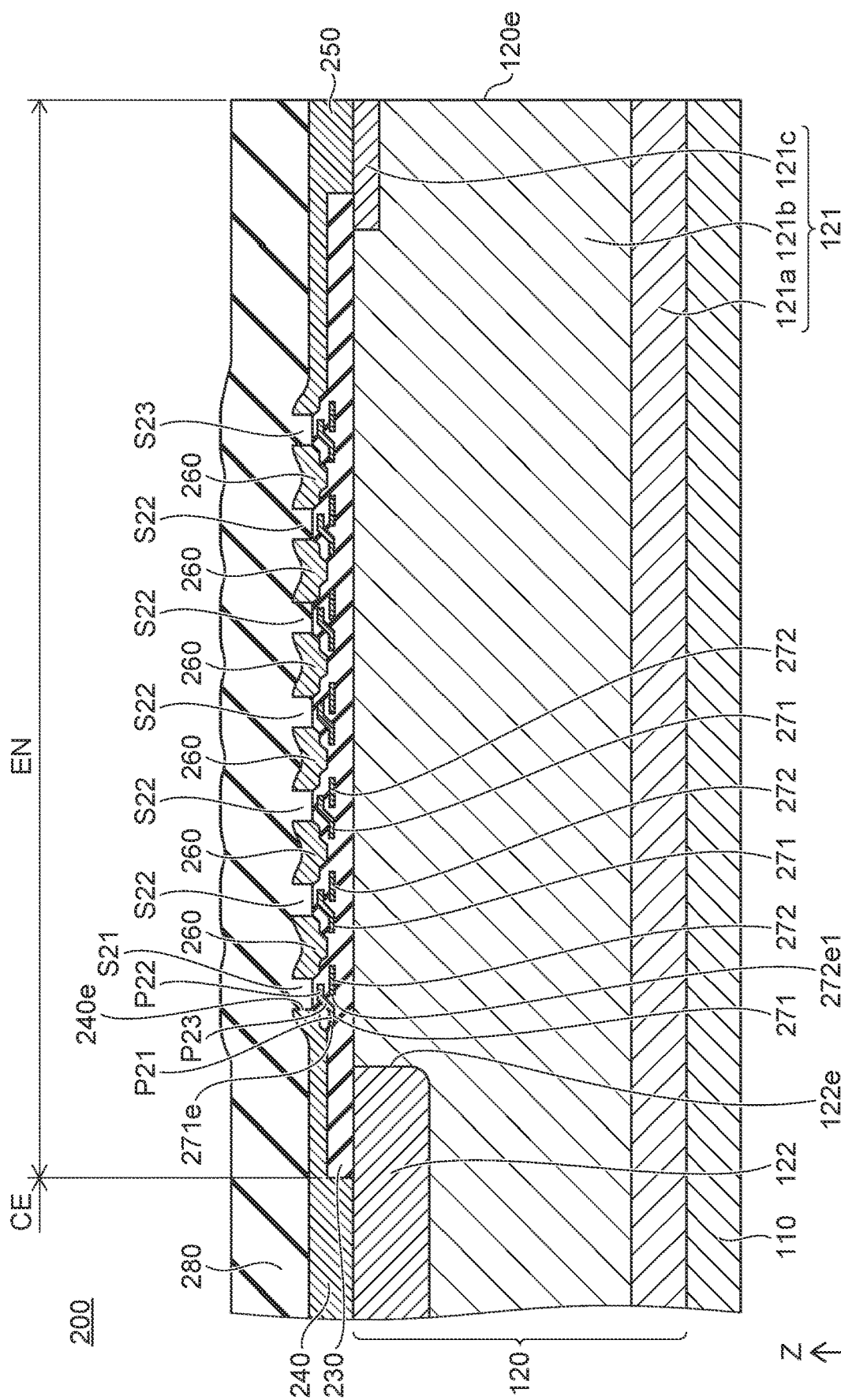
FIG. 9 is a cross-sectional view showing a semiconductor device according to a second embodiment.

FIG. 9 is a cross-sectional view showing a semiconductor device according to the embodiment.

Other than the lower electrode 110 and the semiconductor part 120, the structure of the termination region EN of the semiconductor device 200 according to the embodiment is different from the structure of the termination region EN of the semiconductor device 100 according to the first embodiment.

As a general rule in the following description, only the differences with the first embodiment are described. Other than the items described below, the embodiment is similar to the first embodiment.

The shape of an insulating film 230 according to the embodiment differs from the shape of the insulating film 130 according to the first embodiment. According to the first embodiment, the upper surface of the insulating film 130 is a flat surface and is parallel to the X-direction and the Y-direction. Conversely, according to the embodiment, regions of the upper surface of the insulating film 230 swell upward where multiple first floating electrodes 271 and multiple second floating electrodes 272 are located directly under the regions.

Also, according to the embodiment, the shapes of an upper electrode 240 and an EQPR electrode 250 are different from the shapes of the upper electrode 140 and the EQPR electrode 150 according to the first embodiment. According to the first embodiment, the portions of the upper electrode 140 and the EQPR electrode 150 that are positioned on the insulating film 130 have flat plate shapes. Conversely, according to the embodiment, the upper electrode 240 and the EQPR electrode 250 ride up onto the portions of the upper surface of the insulating film 230 that swell upward. Therefore, the outer end portion of the upper electrode 240 and the inner end portion of the EQPR electrode 250 are curved along the upper surface of the insulating film 230.

Although an example is described in the first embodiment in which the two intermediate electrodes 161 and 162 are included in the semiconductor device 100, six intermediate electrodes 260 are included in the semiconductor device 200 according to the embodiment. Thus, the number of intermediate electrodes included in the semiconductor device is not particularly limited. For example, the number of intermediate electrodes included in the semiconductor device can be set according to the required breakdown voltage of the semiconductor device. It is favorable for the number of intermediate electrodes included in the semiconductor device to increase as the required breakdown voltage of the semiconductor device increases.

The multiple intermediate electrodes 260 are located between the upper electrode 240 and the EQPR electrode 250 on the insulating film 230. The multiple intermediate electrodes 260 are arranged in the direction from the center C of the semiconductor part 120 toward the outer perimeter 120e when viewed from above and are separated from each other. The intermediate electrode 260 that is positioned innermost among the multiple intermediate electrodes 260 is separated from the upper electrode 240. The intermediate electrode 260 that is positioned outermost among the multiple intermediate electrodes 260 is separated from the EQPR electrode 250.

Accordingly, a gap S21 is formed between the upper electrode 240 and the intermediate electrode 260 that is positioned innermost. A gap S22 is formed between the adjacent intermediate electrodes 260. A gap S23 is formed between the EQPR electrode 250 and the intermediate electrode 260 that is positioned outermost.

Although the intermediate electrodes 161 and 162 according to the first embodiment have flat plate shapes, the central portions along the upper surface of the insulating film 230 of the intermediate electrodes 260 according to the embodiment are concave downward. Thus, the shapes of the intermediate electrodes are not particularly limited as long as a gap is formed between the upper electrode, the other intermediate electrodes, or the EQPR electrode.

According to the embodiment, the first floating electrode 271 and the second floating electrode 272 are located directly under the gaps S21, S22, and S23. According to the embodiment, seven first floating electrodes 271 are included in the semiconductor device 200 because the total number of the gaps S21, S22, and S23 is seven. Similarly, seven second floating electrodes 172 are included in the semiconductor device 200. Thus, the number of gaps that are formed on the insulating film in the termination region is not particularly limited as long as the number is not less than 1. It is favorable to provide numbers of first floating electrodes and second floating electrodes in the termination region that correspond to the number of gaps.

Similarly to the first embodiment, the floating electrodes 271 and 272 are made of a semiconductor material such as polysilicon or the like or a metal material. Similarly to the first embodiment, the floating electrodes 271 and 272 each have a substantially rectangular ring shape with rounded corners when viewed from above. The multiple floating electrodes 271 and 272 are separated from each other. The entirety of the floating electrodes 271 and 272 is covered with the insulating film 230.

Among the multiple first floating electrodes 271 and the multiple second floating electrodes 272, the configurations of the first floating electrode 271 and the second floating electrode 272 that are located directly under the gap S21 that is between the upper electrode 240 and the intermediate electrode 260 positioned innermost will now be described. The other first floating electrodes 271 and the other second floating electrodes 272 are similarly configured, and a description is therefore omitted.

The first floating electrode 271 overlaps the gap S21 and the upper electrode 240 when viewed from above. The first floating electrode 271 faces the upper electrode 240 via the insulating film 230. Although the inner perimeter 171e1 of the first floating electrode 171 according to the first embodiment is positioned further inward than the outer perimeter 122e of the p-type semiconductor layer 122, an inner perimeter 271e1 of the first floating electrode 271 according to the embodiment is positioned further outward than the outer perimeter 122e of the p-type semiconductor layer 122. Thus, the position of the inner perimeter 271e1 is not particularly limited as long as the position of the inner perimeter 271e1 is further outward than the inner perimeter of the insulating film 230 and further inward than the outer perimeter of the upper electrode 240.

According to the embodiment, the first floating electrode 271 includes a first portion P21 that is positioned further inward than the second floating electrode 272 and is adjacent to the second floating electrode 272 in the direction from the center C of the semiconductor part 120 toward the outer perimeter 120e, a second portion P22 that is positioned above the second floating electrode 272, and a third portion P23 that is positioned between the first portion P21 and the second portion P22 and is linked to the first and second portions P21 and P22. Although the third portion P3 according to the first embodiment extends in the Z-direction, the third portion P23 according to the embodiment extends in a direction that is oblique to the Z-direction. Thus, the extension direction of the third portion is not particularly limited as long as the first portion and the second portion can be connected.

The second floating electrode 272 overlaps the first floating electrode 271 in the gap S21 when viewed from above. Also, the second floating electrode 272 overlaps the intermediate electrode 260 when viewed from above. The second floating electrode 272 faces the intermediate electrode 260 via the insulating film 230.

Although the inner perimeter 172e1 of the second floating electrode 172 according to the first embodiment is positioned further inward than the outer perimeter 140e of the upper electrode 140 when viewed from above, an inner perimeter 272e1 of the second floating electrode 272 according to the embodiment is positioned further outward than an outer perimeter 240e of the upper electrode 240 when viewed from above. Thus, it is sufficient for the position of the inner perimeter 272e1 to be further inward than the inner perimeter of the intermediate electrode 260 and the outer perimeter of the first floating electrode 271 when viewed from above.

In the semiconductor device 200 according to the embodiment, the first floating electrode 271 and one electrode of an adjacent pair of electrodes among the multiple electrodes 240, 260, and 250 are capacitively coupled. Also, the first floating electrode 271 and the second floating electrode 272 are capacitively coupled. The second floating electrode 272 and the other electrode of the adjacent pair of electrodes also are capacitively coupled.

The semiconductor device 200 according to the embodiment also differs from the first embodiment by further including a protective film 280 that covers the upper electrode 240, the EQPR electrode 250, the multiple intermediate electrodes 260, and the portions of the insulating film 230 that are exposed from under these electrodes 240, 250, and 260. Thus, the protective film 280 may be included in the semiconductor device 200. The protective film 280 is made of an insulating material such as a resin material, etc.

Figure 10:
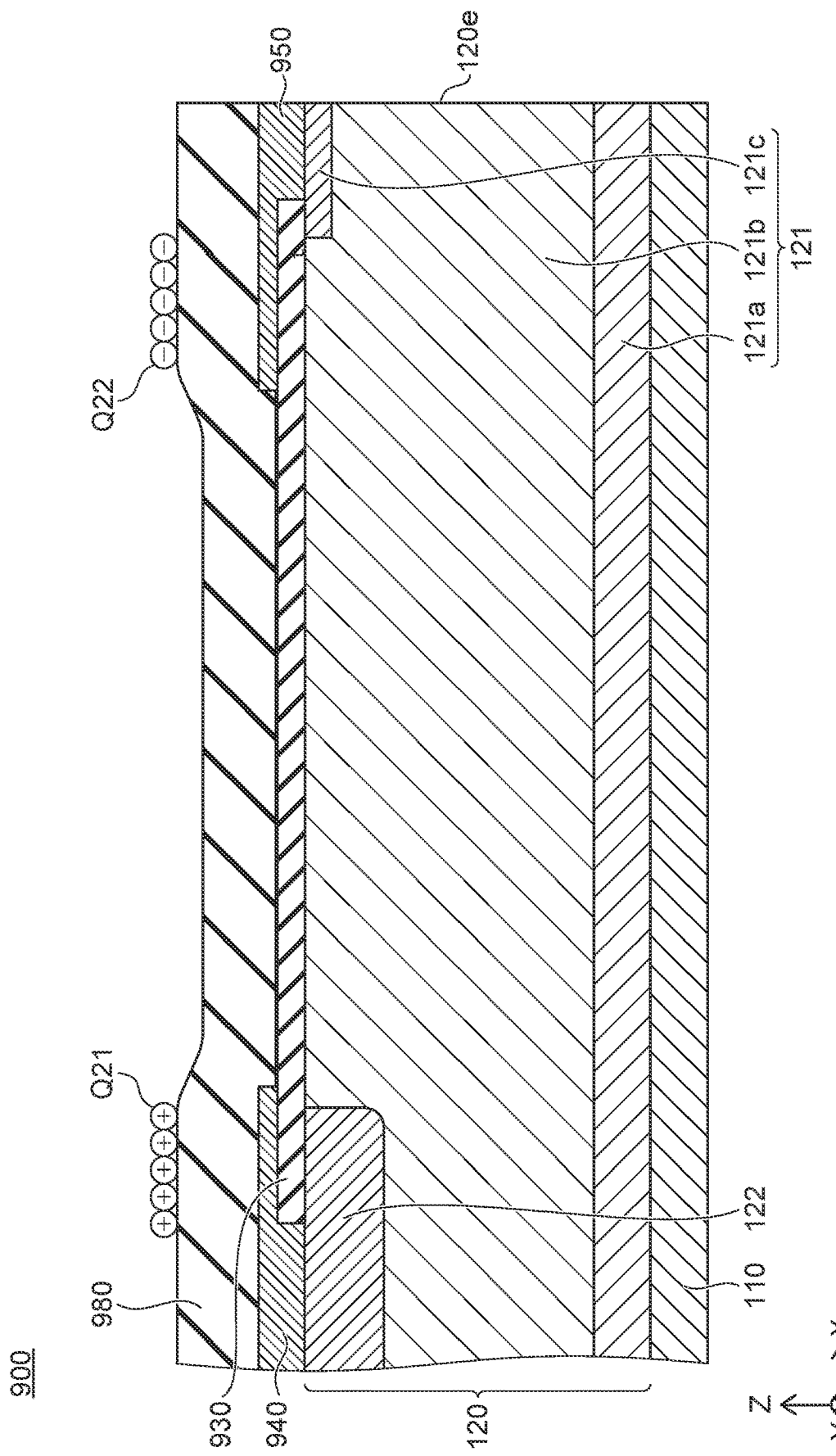
FIG. 10 is a cross-sectional view showing a semiconductor device according to a reference example.

FIG. 10 is a cross-sectional view showing a semiconductor device according to a reference example.

Figure 11:
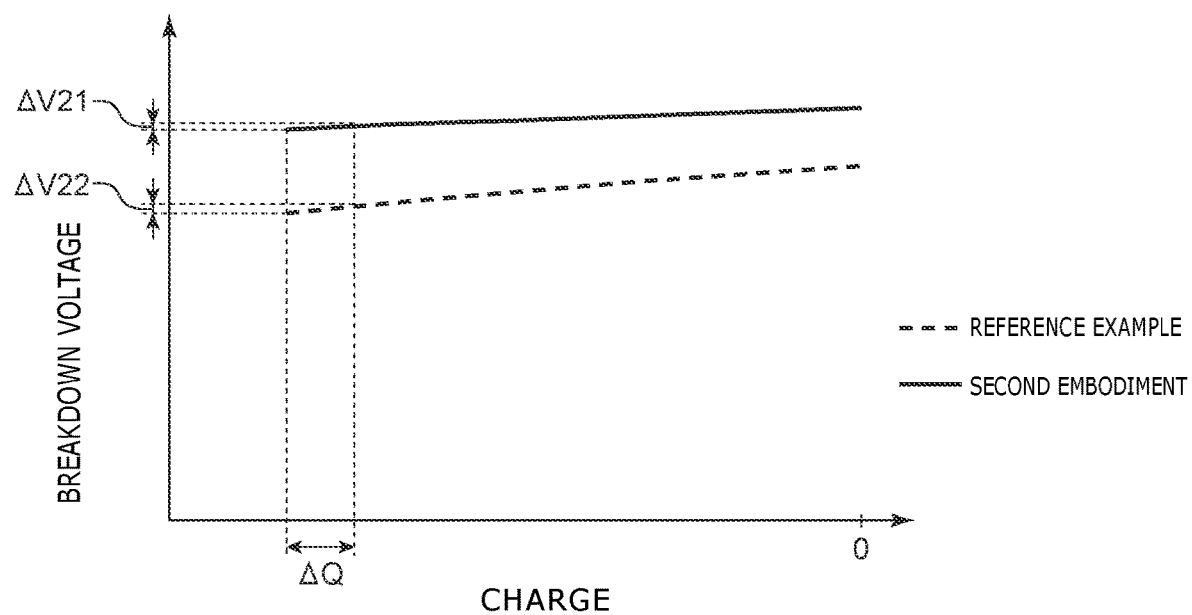
FIG. 11 is a graph showing simulation results of the relationship between the breakdown voltage and the charge for the semiconductor device according to the second embodiment and the semiconductor device according to the reference example, in which the horizontal axis is the charge generated at the surface of the protective film, and the vertical axis is the breakdown voltage.

FIG. 11 is a graph showing simulation results of the relationship between the breakdown voltage and the charge for the semiconductor device according to the embodiment and the semiconductor device according to the reference example, in which the horizontal axis is the charge generated at the surface of the protective film, and the vertical axis is the breakdown voltage.

Figure 12:
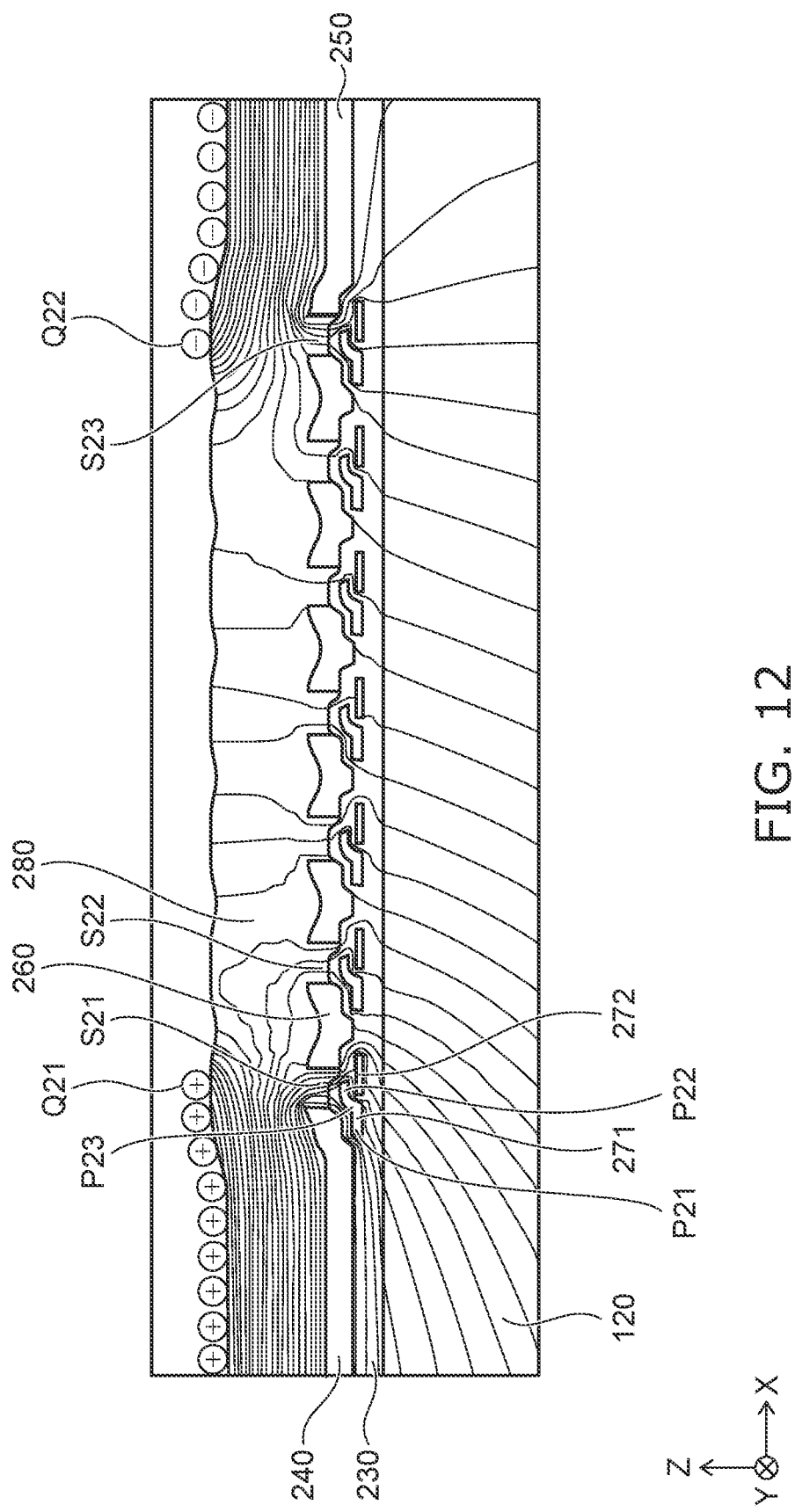
FIG. 12 is simulation results showing equipotential lines of the semiconductor device according to the second embodiment in a state in which a positive charge and a negative charge are generated at the surface of the protective film.

FIG. 12 is simulation results showing equipotential lines of the semiconductor device according to the embodiment in a state in which a positive charge and a negative charge are generated at the surface of the protective film.

As shown in FIG. 10, similarly to the semiconductor device 200 according to the embodiment, the semiconductor device 900 according to the reference example includes the lower electrode 110, the semiconductor part 120, an insulating film 930, an upper electrode 940, an EQPR electrode 950, and a protective film 980. The semiconductor device 900 according to the reference example differs from the semiconductor device 200 according to the embodiment in that an intermediate electrode is not provided in the gap between the upper electrode 940 and the EQPR electrode 950 on the insulating film 930, and in that the first floating electrode and the second floating electrode are not provided in the insulating film 930.

According to the embodiment as described above, the first floating electrode 271 and one electrode of an adjacent pair of electrodes among the multiple electrodes 240, 260, and 250 are capacitively coupled, the first floating electrode 271 and the second floating electrode 272 are capacitively coupled, and the second floating electrode 272 and the other electrode of the adjacent pair of electrodes are capacitively coupled. Therefore, as shown in FIG. 12, the potential can be changed in stages between the upper electrode 240 and the EQPR electrode 250. Specifically, as shown in FIG. 12, the equipotential lines in the gap S21 are dispersed between the upper electrode 240 and the first floating electrode 271, between the second floating electrode 272 between and the first floating electrode 271, and between the second floating electrode 272 and the intermediate electrode 260. Thus, the occurrence of avalanche breakdown can be suppressed by suppressing dense equipotential lines of the semiconductor part 120 in the termination region EN, that is, by suppressing the occurrence of a location at which the potential abruptly changes in the termination region EN of the semiconductor part 120. As a result, the breakdown voltage of the semiconductor device 200 can be increased. Accordingly, as shown in FIG. 11, the breakdown voltage of the semiconductor device 200 according to the embodiment is greater than the breakdown voltage of the semiconductor device 900 according to the reference example.

In particular, according to the embodiment as shown in FIG. 12, the first floating electrode 271 includes the first portion P21 that is positioned further inward than the second floating electrode 272, the second portion P22 that is positioned above the second floating electrode 272, and the third portion P23 that is linked to the first and second portions. Therefore, the equipotential lines in the gap S21 are dispersed between the upper electrode 240 and the first floating electrode 271, between the first floating electrode 271 and the second floating electrode 272, and between the second floating electrode 272 and the intermediate electrode 260, pass through the semiconductor part 120 from the gap S21, and extend toward the center C of the semiconductor part 120. Therefore, the equipotential lines in the semiconductor part 120 are easily dispersed. This is similar for the first floating electrode 271 and the second floating electrode 272 directly under the other gaps S22 and S23 as well.

In the semiconductor device 200 according to the reference example as shown in FIGS. 10 and 11, the breakdown voltage when a positive charge Q21 and a negative charge Q22 occur at the surface of the protective film 980 is small compared to the breakdown voltage when the positive charge Q21 and the negative charge Q22 do not occur at the surface of the protective film 980. Also, the breakdown voltage decreases as the absolute values of the positive charge Q21 and/or the negative charge Q22 increase.

The semiconductor device 200 according to the embodiment also has a similar tendency. In the semiconductor device 900 according to the reference example as shown in FIG. 10, a member that shields the effects on the semiconductor part 120 of the charges Q21 and Q22 between the upper electrode 940 and the EQPR electrode 950 is not provided. Conversely, in the semiconductor device 200 according to the embodiment as shown in FIG. 12, the multiple intermediate electrodes 260 are located between the upper electrode 940 and the EQPR electrode 950, and the first floating electrode 171 and the second floating electrode 172 overlap directly under the gaps S21, S22, and S23. Therefore, in the semiconductor device 200 according to the embodiment, the effects on the semiconductor part 120 of the charges Q21 and Q22 can be shielded. Accordingly, in the semiconductor device 200 according to the embodiment as shown in FIG. 11, a reduction amount ΔV21 of the breakdown voltage when the charge is changed by a prescribed amount ΔQ is less than a reduction amount ΔV22 of the breakdown voltage when the charge is changed by the prescribed amount ΔQ in the semiconductor device 900 according to the reference example. In other words, the reduction of the breakdown voltage caused by the charges Q21 and Q22 is less in the embodiment than in the reference example.

As described above, in the semiconductor device 200 according to the embodiment as well, the potential can be changed in stages between the one electrode and the other electrode of an adjacent pair of electrodes among the multiple electrodes 240, 260, and 250. The avalanche breakdown can be suppressed thereby, and the breakdown voltage of the semiconductor device 200 can be increased.

According to the embodiment as well, the first floating electrode 171 and the second floating electrode 172 that overlap below the gaps S21, S22, and S23 function as a shield for the charges Q21 and Q22 that is generated at the surface of the semiconductor device 200. Therefore, the occurrence of the negative charge Q3 and/or the positive charge Q4 at the upper layer portion of the semiconductor part 120 can be suppressed.

Thus, a highly-reliable semiconductor device 200 can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device,
a cell region and a termination region being set in the device,
the termination region surrounding the cell region,
the device comprising:
   a first electrode;
   a semiconductor part located on the first electrode;
   an insulating film located on the semiconductor part in the termination region;
   a plurality of second electrodes located on the insulating film and arranged in a first direction, the first direction being from a center of the semiconductor part toward an outer perimeter of the semiconductor part when viewed from above, the plurality of second electrodes being separated from each other;
   a first floating electrode located in the insulating film, the first floating electrode overlapping a gap between a pair of adjacent second electrodes among the plurality of second electrodes when viewed from above, the first floating electrode facing one of the pair of second electrodes via the insulating film; and
   a second floating electrode located in the insulating film, the second floating electrode being separated from the first floating electrode, the second floating electrode overlapping the first floating electrode in the gap when viewed from above, a portion of the second floating electrode overlapping the first floating electrode and being positioned below a portion of the first floating electrode overlapping the gap, the second floating electrode facing the other of the pair of second electrodes via the insulating film.

2. The device according to claim 1, wherein
the first floating electrode overlaps a second electrode positioned inward among the pair of second electrodes when viewed from above, and
the second floating electrode overlaps a second electrode positioned outward among the pair of second electrodes when viewed from above.

3. The device according to claim 1, wherein
the first floating electrode includes:
   a first portion positioned further inward than the second floating electrode, the first portion being adjacent to the second floating electrode in the first direction;
   a second portion positioned above the second floating electrode; and
   a third portion positioned between the first portion and the second portion and linked to the first and second portions.

4. The device according to claim 1, wherein
the semiconductor part includes:
   a first semiconductor layer located on the first electrode, the first semiconductor layer being of a first conductivity type; and a second semiconductor layer located at an upper layer portion of the first semiconductor layer, the second semiconductor layer being of a second conductivity type and being positioned further inward than an outer perimeter of the first semiconductor layer when viewed from above, when viewed from above, the insulating film overlaps an outer perimeter portion of the second semiconductor layer and a portion of the first semiconductor layer positioned further outward than the second semiconductor layer, a second electrode positioned innermost among the plurality of second electrodes is connected to a portion of the second semiconductor layer positioned further inward than the insulating film, and a second electrode positioned outermost among the plurality of second electrodes is connected to a portion of the first semiconductor layer positioned further outward than the insulating film.

5. The device according to claim 4, wherein the first semiconductor layer includes:

a first semiconductor region located on the first electrode;

a second semiconductor region located on the first semiconductor region, an impurity concentration of the second semiconductor region being less than an impurity concentration of the first semiconductor region; and a third semiconductor region located at an outer perimeter portion of the second semiconductor region at the upper layer portion, an impurity concentration of the third semiconductor region being greater than the impurity concentration of the second semiconductor region, and the second electrode positioned outermost is connected to the third semiconductor region.

6. The device according to claim 1, wherein the first floating electrode and the second floating electrode include polysilicon.

* * * * *